(12) United States Patent
Kato et al.

(10) Patent No.: US 7,864,531 B2
(45) Date of Patent: Jan. 4, 2011

(54) ELECTRONIC DEVICE

(75) Inventors: Yasuhiro Kato, Nagoya (JP); Shigeru Suzuki, Nagoya (JP); Koji Imai, Inuyama (JP)

(73) Assignee: Brother Kogyo Kabushiki Kaisha, Nagoya-shi, Aichi-ken (JP)

( * ) Notice: Subject to any disclaimer, the term of this patent is extended or adjusted under 35 U.S.C. 154(b) by 188 days.

(21) Appl. No.: 12/099,673

(22) Filed: Apr. 8, 2008

(65) Prior Publication Data

US 2008/0253091 A1 Oct. 16, 2008

(30) Foreign Application Priority Data

Apr. 10, 2007 (JP) ............................. 2007-102682

(51) Int. Cl.
*H05K 7/20* (2006.01)
(52) U.S. Cl. ..................... 361/707; 361/704; 361/762; 347/18; 347/58; 257/684; 174/541
(58) Field of Classification Search ................ 361/700, 361/704, 707, 708, 710, 719, 762, 768
See application file for complete search history.

(56) References Cited

U.S. PATENT DOCUMENTS 5,886,877 A * 3/1999 Shingai et al. .............. 361/768

| | | | |
|---|---|---|---|
| 7,149,090 B2 * | 12/2006 | Suzuki et al. ............... | 361/762 |
| 7,282,842 B2 * | 10/2007 | Kim et al. ...................... | 313/46 |
| 7,414,204 B2 * | 8/2008 | Ahn et al. .................... | 174/541 |
| 7,441,873 B2 * | 10/2008 | Silverbrook ................. | 347/49 |
| 7,570,494 B2 * | 8/2009 | Suzuki et al. ............... | 361/762 |
| 2003/0107874 A1 * | 6/2003 | Feigenbaum et al. ........ | 361/704 |
| 2005/0219301 A1 | 10/2005 | Suzuki | |
| 2007/0230132 A1 * | 10/2007 | Lee ............................. | 361/707 |
| 2009/0185357 A1 * | 7/2009 | Rendek et al. ............... | 361/762 |

FOREIGN PATENT DOCUMENTS

JP 2005288957 A 10/2005

* cited by examiner

*Primary Examiner*—Jayprakash N Gandhi
*Assistant Examiner*—Courtney Smith
(74) *Attorney, Agent, or Firm*—Baker Botts, LLP

(57) ABSTRACT

An electronic device includes an FPC, a circuit chip arranged on the flexible flat cable, a heat sink arranged on the circuit chip to release a heat of the circuit chip, and an elastic member arranged on a lower surface of the FPC. The upper surface of the FPC is large enough to cover a contact surface of the circuit chip. The elastic member does not overlap with an apex portion of the circuit chip, but overlaps with the circuit chip at an inner side of the apex portion. Therefore the elastic member does not press the FPC against the apex portion of the circuit chip. Accordingly, the FPC at a position corresponding to an apex of the circuit chip is suppressed from being distorted, and there is no fear of breaking of wire and exfoliation of the circuit chip.

14 Claims, 5 Drawing Sheets

ELECTRONIC DEVICE

CROSS REFERENCE TO RELATED APPLICATION

The present application claims priority from Japanese Patent Application No. 2007-102682, filed on Apr. 10, 2007, the disclosure of which is incorporated herein by reference in its entirety.

BACKGROUND OF THE INVENTION

1. Field of the Invention

The present invention relates to an electronic device in which a drive circuit chip is mounted on a flexible flat cable.

2. Description of the Related Art

An electronic device in which a circuit chip such as a drive circuit chip is mounted on a flexible flat cable, has hitherto been known. For example, an ink-jet printer disclosed in Japanese Patent Application Laid-open No. 2005-288957, includes a head unit which prints to record images by jetting an ink on to a recording medium, a flexible flat cable which is connected to the head unit and through which a data signal is supplied, and a drive circuit chip which is mounted on the flexible flat cable. The data signal is converted to a voltage-waveform signal suitable for drive of the head by the drive circuit chip, and is supplied to the head unit.

Since the drive circuit chip releases heat when the head unit is driven, the drive circuit chip is arranged to be in contact with a heat sink.

In the ink-jet printer disclosed in Japanese Patent Application Laid-open No. 2005-288957, a heat sink 503, a drive circuit chip 502, a flexible flat cable 501, and an elastic member 504A in the form of rubber are stacked in order from an upper side, as shown in FIG. 5. Moreover, due to an elastic force of the elastic member 504A, the drive circuit chip 502 is pressed against the heat sink 503 via the flexible flat cable 501. Normally, as shown in FIG. 5B, in a plan view, a length L2 of the elastic member 504A is longer than a width W1 and a length L1 of the drive circuit chip 502.

SUMMARY OF THE INVENTION

Since the drive circuit chip 502 and the heat sink 503 are rigid bodies in general, the drive circuit chip 502 depresses the flexible flat cable 501 and the elastic member 504A to form a recess along an outline thereof as shown in FIG. 5A. Particularly, the flexible flat cable 501 is bent three-dimensionally in an intricate manner at an apex portion (corner portion, vertex portion) 502A in a plan view of the drive circuit chip 502. Therefore, wires of the flexible flat cable 501 might be broken at the apex portion 502A, and the drive circuit chip 502 might be exfoliated from the flexible flat cable 501.

An object of the present invention is to solve the above-mentioned issues, and to provide an electronic device in which an electronic circuit (circuit chip) such as a drive circuit chip is mounted on the flexible flat cable, and in which a distortion of the flexible flat cable at a position corresponding to an apex of the circuit chip is suppressed when the heat sink and the circuit chip are in contact, and there is no fear of breaking of a wire of the flexible flat cable and exfoliating of the drive circuit chip.

According to a first aspect of the present invention, there is provided an electronic device including:

a flexible flat cable which is extended in a predetermined extending direction;

a circuit chip having a first contact surface which makes a contact with an upper surface of the flexible flat cable, the first contact surface having a corner portion;

a heat sink which is arranged on the circuit chip to make a thermal contact with the circuit chip, and which releases a heat of the circuit chip; and an elastic member which is arranged under a lower surface of the flexible flat cable at a position overlapping with the heat sink, wherein the upper surface of the flexible flat cable is large enough to entirely cover the first contact surface of the circuit chip; and the elastic member does not overlap with the corner portion of the circuit chip, but overlaps with the circuit chip at an inner portion of the circuit chip located inside the corner portion, and the elastic member does not press the flexible flat cable against the corner portion of the circuit chip.

According to the first aspect of the present invention, it is possible to press the circuit chip against the heat sink via the flexible flat cable by an elastic force of the elastic member. At this time, since the elastic member has a size of a degree such that the elastic member does not overlap with the corner portion of the circuit chip, but overlaps with the circuit chip (drive circuit chip) at an inner side of the corner portion, no thrust is exerted on the corner portion of the circuit chip. Therefore, it is possible to suppress the flexible flat cable from being distorted by the corner portion.

In the electronic device of the present invention, the circuit chip may have a rectangular shape having a predetermined width and a predetermined length; and one of a width and a length of the elastic member may be smaller than each of the width and the length of the circuit chip.

In this case, it is possible to use the elastic member having the width shorter than the width of the rectangular drive circuit chip and/or the elastic member having the length shorter than the length of the rectangular drive circuit chip. Therefore, it is possible to realize easily a structure in which the flexible flat cable is not pressed against the corner portion of the circuit chip.

In the electronic device of the present invention, the circuit chip may have a rectangular shape which is elongated in an orthogonal direction orthogonal to the extending direction; and a length of the elastic member in the orthogonal direction may be smaller than a length of the circuit chip in the orthogonal direction.

In this case, when a rectangular circuit chip which is long in a direction orthogonal to the direction of drawing is mounted on the flexible flat cable, the elastic member does not press a corner portion of both ends of the chip. Therefore, the thrust is suppressed from being exerted on the flexible flat cable by the corner portion of the circuit chip.

In the electronic device of the present invention, the heat sink may have a second contact surface which makes a contact with the circuit chip; the second contact surface may be large enough to entirely cover a surface, of the circuit chip, facing the second contact surface; and a dent which is capable of accommodating the circuit chip may be formed in the second contact surface.

In this case, since the dent is provided in the contact surface of the heat sink, it is possible to position the circuit chip accurately. Therefore, it is possible to fix the circuit chip to a correct position by using the heat sink of an appropriate size without a need to make the heat sink large upon taking into consideration a position shift of the circuit chip.

In the electronic device of the present invention, the elastic member may be fixed to the lower surface of the flexible flat cable at a position overlapping with the circuit chip.

In this case, since the elastic member is fixed to the lower surface of the flexible flat cable, at the position overlapping with the circuit chip, relative positions of the circuit chip and the elastic member are not displaced. Therefore, even when the heat sink is brought in contact, it is possible to stack with a correct positional relationship all the time. Accordingly, one-side hitting with respect to the drive circuit chip does not occur, and it is possible to prevent an assembling defect.

In the electronic device of the present invention, the elastic member may be made of a rubber.

In this case, since the elastic member is an elastic body in the form of rubber, an elasticity of the elastic member is easily adjustable to an appropriate elasticity. Therefore, it is possible to pinch softly the circuit chip which is mounted on the flexible flat cable, by the heat sink and the elastic member.

In the electronic device of the present invention, the heat sink may be formed of a metallic plate which is bent in a U shape. In this case, since the heat sink is bent in the U shape, it is possible to increase a surface area of the heat sink, and to improve a heat release effect. Moreover, since the heat sink is formed of a metal, a thermal conductivity is high, and it is possible to release efficiently the heat of the circuit chip.

According to a second aspect of the present invention, there is provided an electronic device including:

a flexible flat cable which is extended in a predetermined extending direction;

a circuit chip having a first contact surface which makes a contact with an upper surface of the flexible flat cable, the first contact surface having a corner portion and two edge line portions which are extended from the corner portion;

a heat sink which is arranged on the circuit chip to make a thermal contact with the circuit chip, and which releases a heat of the circuit chip; and an elastic member which is arranged under a lower surface of the flexible flat cable at a position overlapping with the heat sink, wherein the upper surface of the flexible flat cable is large enough to entirely cover the first contact surface of the circuit chip; and the elastic member does not overlap with one of the edge line portions of the circuit chip.

According to the second aspect of the present invention, in the electronic device in which, the drive circuit chip is mounted on the flexible flat cable, the elastic member does not overlap with at least one edge line portion out of the two edge line portions extended from the angular portion of the circuit chip. Therefore, with the heat sink and the circuit chip in contact, even when the flexible flat cable is bent along one edge line (portion) of the circuit chip, the flexible flat cable is not bent along the other edge line (portion). In other words, the flexible flat cable is not bent three-dimensionally, at a position corresponding to the corner of the drive circuit chip. Therefore, and it is possible to achieve an electronic device in which, the distortion of the flexible flat cable is suppressed, and there is no possibility of cutting (breaking) of the wire, and exfoliation of the circuit chip.

DETAILED DESCRIPTION OF THE PREFERRED EMBODIMENTS

Figure 1:
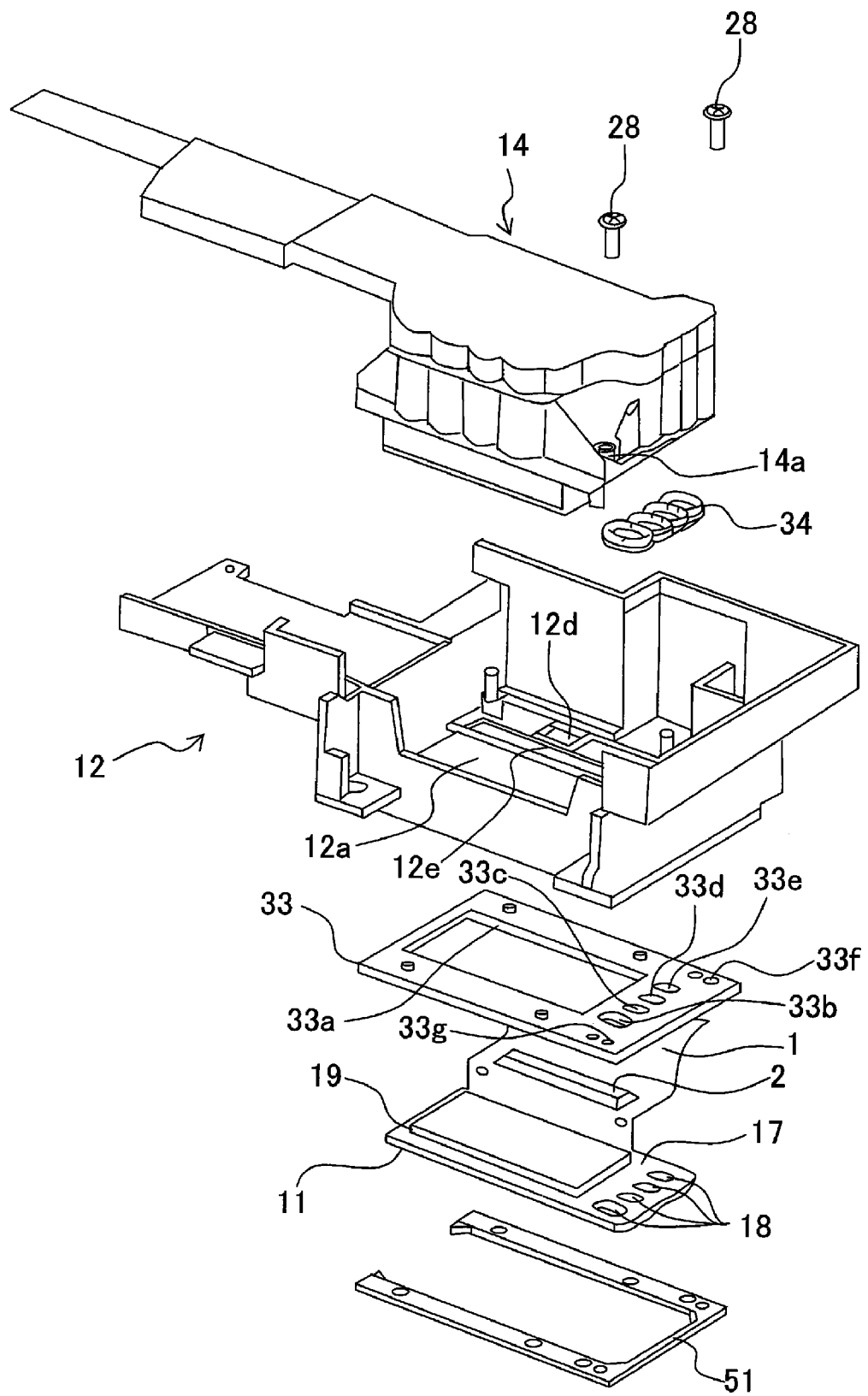
FIG. 1 is an exploded perspective view of main components of an ink-jet printer head to which the present invention is applied.
Figure 2:
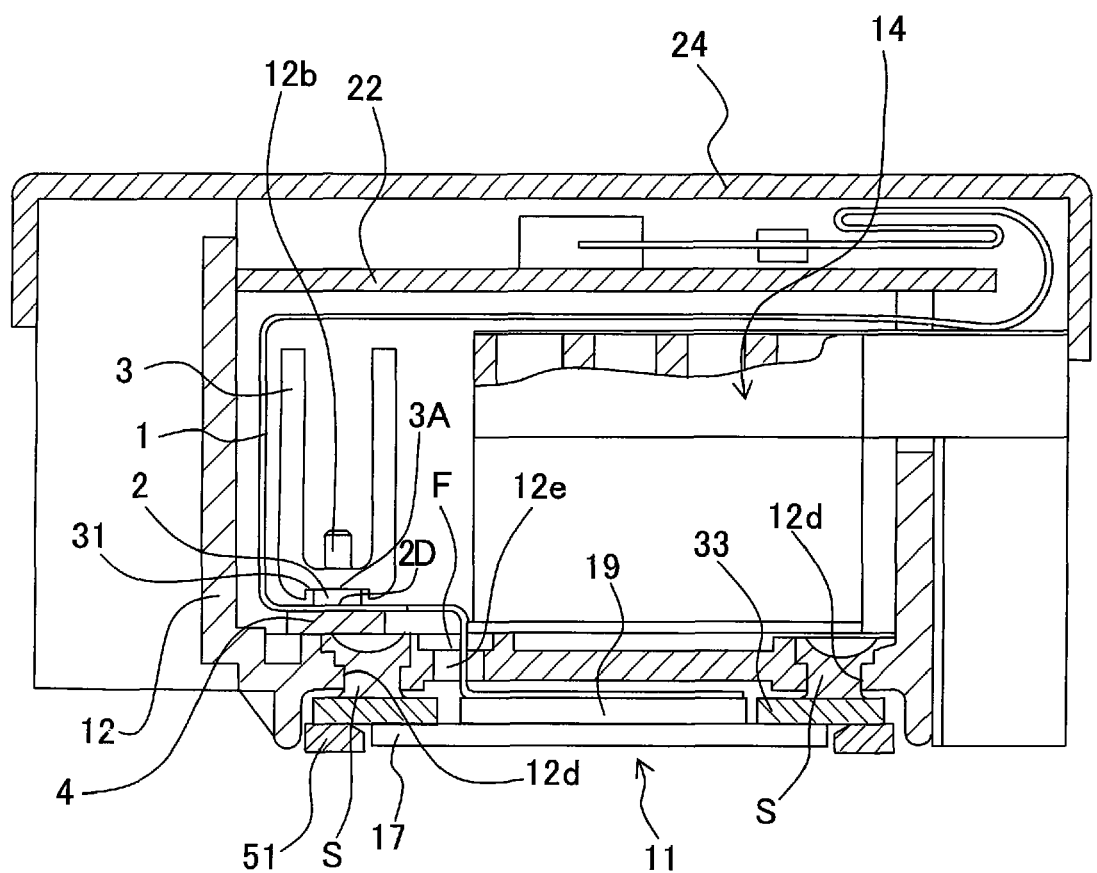
FIG. 2 is a cross-sectional view of the ink-jet printer head in FIG. 1.

As an embodiment of the present invention, an ink-jet printer head, to which the present invention is applied, will be described below in detail with reference to the accompanying diagrams. FIG. 1 is an exploded perspective view of main components of the ink-jet printer head, and FIG. 2 is a cross-sectional view of the ink-jet printer head.

As shown in FIG. 1, in the embodiment, an ink-jet printer head 100 has a recording head 11 as an electrical load, and a casing 12 which supports (accommodates) the recording head 11.

Similarly as a known recording head for an inkjet printer, the recording head 11 has a cavity portion 17, in a lower surface of which a plurality of nozzles (not shown in the diagrams) are formed, and an actuator 19 which selectively applies a jetting energy to the ink in each of nozzles which is supplied to the cavity portion 17 from an ink supply port 18, and jets ink droplets from the nozzle by driving of the actuator 19. As the actuator 19, it is possible to use actuators of various types such as, hitherto known piezoelectric driving type, electrostatic driving type, and exothermic driving type. A flexible flat cable 1 for supplying data signals is connected to the actuator 19.

The casing 12 is formed to be box shaped with an upper surface of the box open, and the upper surface thereof is covered by a cover 24. The recording head 11 is fixed by an adhesive to a lower surface of an reinforcing frame 33 The reinforcing frame 33 has a shape of a frame, that is, an opening 33a is formed at a center of the reinforcing frame. Further, an upper surface of the reinforcing frame 33 is fixed by an adhesive S to a lower surface of a bottom wall 12a of the casing 12. The adhesive S is filled on the reinforcing frame 33 via the plurality of openings 12d which are formed through the bottom wall 12a, and is solidified. A protective cover 51 having a U-shape is arranged around the recording head 11.

An ink tank 14 is arranged at an upper side of the bottom wall 12a of the casing 12. The ink tank 14 is fixed to the reinforcing frame 33 by screws 28, the screws 28 being inserted in screw holes 33g and 33f of the reinforcing frame 33 through mounting holes 14a. The ink tank 14 stores a plurality of types of inks, and supplies the ink to the ink supply port 18 of the recording head 11 through passage holes (33b to 33e) in the reinforcing frame 33. A seal member 34 is inserted between an ink outflow port of the ink tank 14 and the passage holes (33b to 33e).

The flexible flat cable 1, which is drawn around inside the casing 12 from an upper surface of the actuator 19 through a slit 12e in the bottom wall 12a, is connected to a circuit substrate 22 made of a rigid body which is arranged inside the casing 12. The circuit substrate (circuit board) 22 is connected to a control section (not shown in the diagram) of a printer main body, via another flexible wire member (not shown in the diagram).

A drive circuit chip (circuit chip) 2 is mounted on the flexible flat cable 1. As it has hitherto been know, the drive circuit chip 2 converts a serial data signal transferred from the control section of the printer main body to a parallel signal for each of the nozzles of the recording head 11 and supplies the converted signal to the actuator 19. The converted parallel signal is a voltage waveform signal which is suitable for the drive of the actuator 19.

To release the heat generated by the drive circuit chip 2, a heat sink 3 is provided inside the casing 12. The heat sink 3 is made of a high heat-conductive material (for example, metallic material such as aluminum, copper, and iron), and is formed to have a cross-sectional U shape. In this embodiment, the heat sink 3 is formed of a metallic plate which is bent in U shape. However, the material of the heat sink is not restricted to the metallic plate as long as a high heat-conductive material. Further, the shape of the heat sink 3 is not restricted to the U shape, and it is possible to form the heat sink 3 of an appropriate size and shape for increasing (making substantial) a heat releasing area.

The heat sink 3 is fixed to one wall inside the casing 12, sandwiching the flexible flat cable 1, the drive circuit chip 2, and the elastic member 4 between the bottom wall 12a for example and the heat sink 3. In this embodiment, a protrusion 12b protruded from the bottom wall 12a is fit in a hole (not shown in the diagram) in the heat sink 3, and the heat sink 3 is fixed to the wall surface 12a by flattening a tip of the protrusion 12b by heat and pressure. A method of fixing the heat sink 3 to the wall surface 12a is not restricted to this method, and a method such as fixing by a screw may be used.

The drive circuit chip 2 is mounted on a surface toward the heat sink 3 of the flexible flat cable 1, and the elastic member 4 is arranged to overlap with the drive circuit chip 2 on an opposite surface of the flexible flat cable, the opposite surface not facing the heat sink. That is, the elastic member 4 is arranged between the flexible flat cable 1 and the bottom wall 12a.

When the heat sink 3 is fixed as described above, the elastic member 4 is compressed by the heat sink 3. At this time, due to a reactive force of the compressed elastic member 4, the drive circuit chip (circuit chip) 2 is pressed toward the heat sink 3 to make a direct contact with the heat sink 3. At the same time, the drive circuit chip 2 makes thermally contact with the heat sink 3. In other words, the drive circuit chip 2 is pinched between the elastic member 4 and the heat sink 3.

Figure 3A:
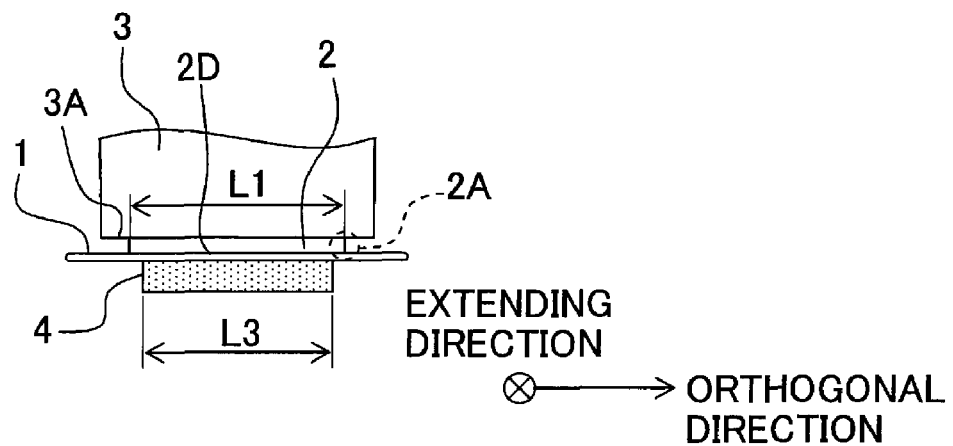
FIG. 3A is a side view in a direction orthogonal to a paper surface in FIG. 2, showing a positional relationship between a drive circuit chip, a heat sink, and an elastic member.
Figure 3B:
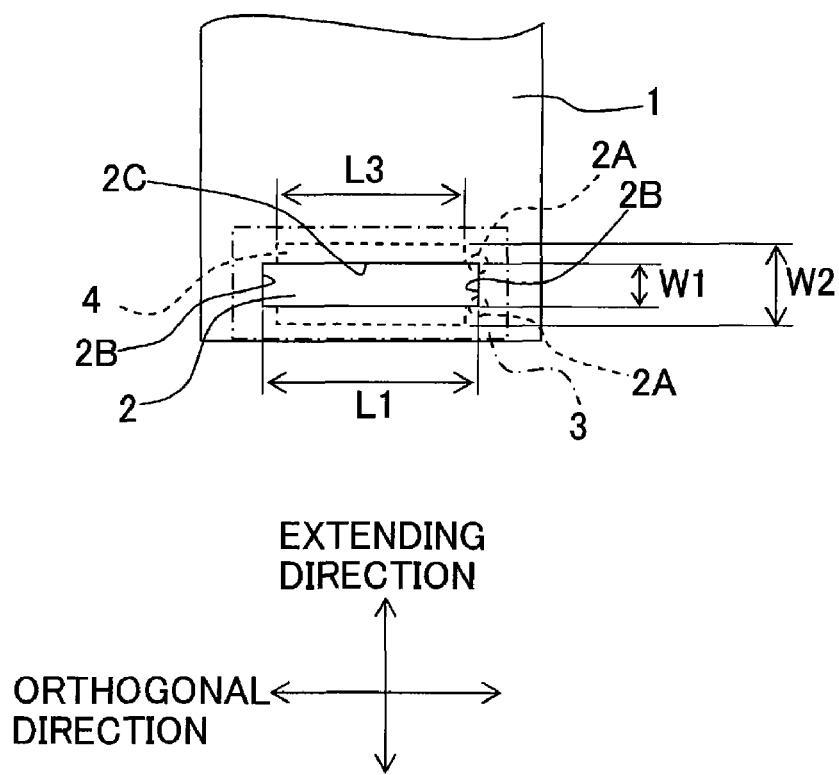
FIG. 3B is a plan view showing the positional relationship between the drive circuit chip, the heat sink, and the elastic member.

The elastic member 4 has a substantially rectangular parallelepiped (rectangular solid) shape, and is formed of rubber, a synthetic resin material, or a porous material thereof. As shown in FIGS. 3A and 3B, a length L3 of the flexible flat cable 1, in an orthogonal direction (width direction of the flexible flat cable) orthogonal to an extending direction in which the flexible flat cable 1 is drawn from the recording head 11 (drawing direction, longitudinal direction of the flexible flat cable) is smaller than a length L1 of the drive circuit chip 2 in the orthogonal direction. Moreover, as shown in FIG. 3B, a width W2 of the elastic member 4, in the extending direction is larger than a width W1 of the drive circuit chip 2 in the same direction. The flexible flat cable 1 is sufficiently larger than the length and the width of the drive circuit chip 2 in a plan view. In other words, the flexible flat cable 1 is large enough to entirely cover the lower surface (first contact surface) 2D of drive circuit chip 2 in a plan view.

Moreover, the elastic member 4 is arranged at a position not facing an apex portion 2A of the drive circuit chip 2 having a rectangular shape in a plan view. Accordingly, even when the elastic member 4 is compressed as described above by the heat sink 3, the flexible flat cable 1 is bent two dimensionally along edge line portions (ridge line portions) 2C at both front and rear ends of the drive circuit chip 2 in the extending direction, but is not bent along edge line portions (ridge line portions) 2B at both left and right ends of the drive circuit chip 2 in the orthogonal direction. In other words, the elastic member 4 overlaps with the edge line portions 2C extending in the orthogonal direction from the apex portion 2A of the drive circuit chip 2, but the elastic member 4 does not overlap with the edge line portions 2B extending in the extending direction from the apex portion 2A of the drive circuit chip 2. Therefore, the flexible flat cable 1 is bent along the edge line portion 2C of the drive circuit chip 2, but is not bent along the edge line portion 2B of the drive circuit chip 2.

Figure 5A:
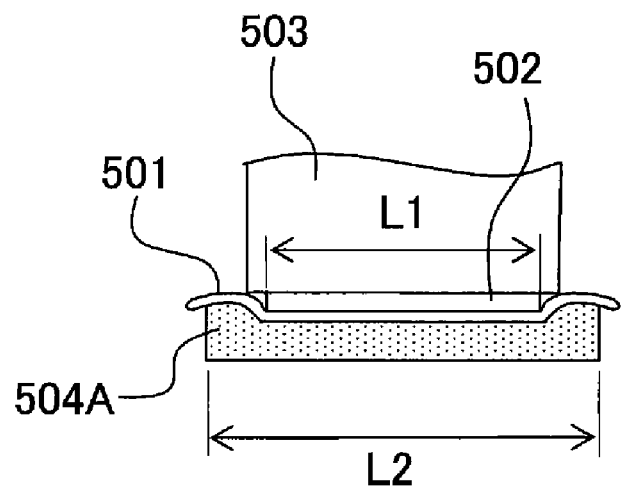
FIGS. 5A and 5B are diagrams corresponding to FIGS. 3A and 3B, respectively, explaining a conventional electronic device.
Figure 5B:
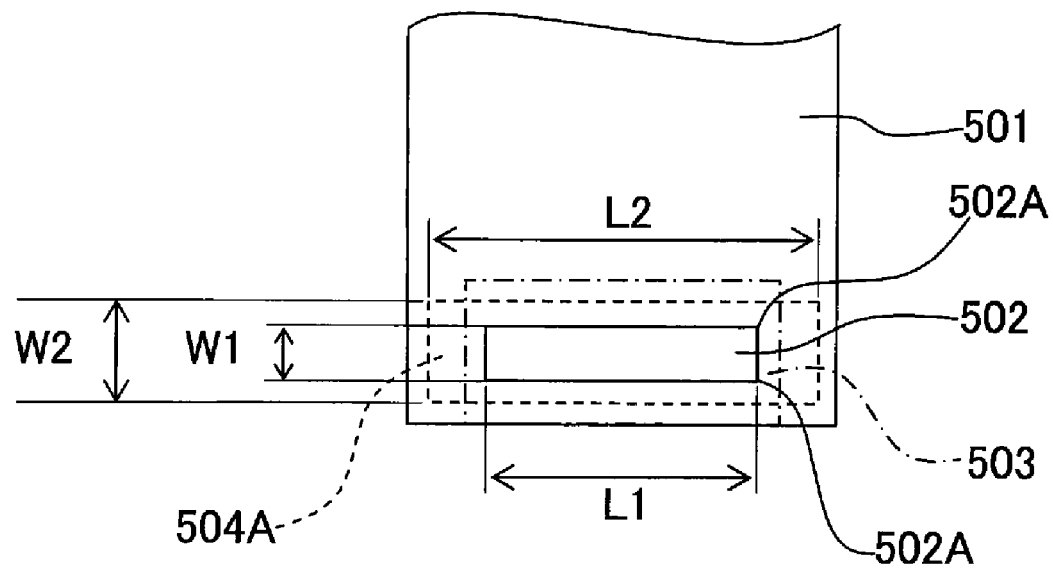

In other words, the flexible flat cable 1 is not bent three dimensionally as shown in FIG. 5. Consequently, it is possible to suppress the wires formed on the flexible flat cable 1 from breaking at the apex portion 2A of the drive circuit chip 2. Further, it is also possible to suppress the drive circuit chip 2 from being exfoliated from the flexible flat cable 1. The words "the flexible flat cable is bent two-dimensionally" means that the flexible flat cable is bent along a predetermined direction. Whereas, the words "the flexible flat cable is bent three-dimensionally" means that when the flexible flat cable is bent in one direction, simultaneously it is bent along another direction, and means a state in which the bending along two directions intersect (cross) mutually. For example, when the flexible flat cable is bent along the extending direction and is also bent along the orthogonal direction, since the flexible flat cable 1 is deformed three-dimensionally in an intricate manner, for example the flexible flat cable 1 is bent to form a corn shape, at a location where the two bends intersect, there is a possibility that the flexible flat cable 1 is damaged.

Since the flexible flat cable 1 is arranged inside the casing 12 while folding (being bent) in the orthogonal direction as shown in FIG. 2, the drive circuit chip 2 makes a contact with the heat sink 3 at a position near a bent (folded) portion. In such case, as it has been described above, it is preferable to make the length L3 of the elastic member 4 to be smaller than the length L1 of the drive circuit chip 2. In a case of arranging the flexible flat cable 1 to be flat without bending (folding), even when the width W2 of the elastic member 4 is made to be smaller than the width W1 of the drive circuit chip 2, the flexible flat cable 1 is bent only two dimensionally. Moreover, when a length and the width of the elastic member 4 is made to be smaller than the length and the width of the drive circuit chip 2, the flexible flat cable 1 is not bent.

In other words, when at least one of the width and the length of the elastic member 4 is shorter than those of the drive circuit chip 2 as viewed from a stacking direction of the drive circuit chip 2, the flexible flat cable 1, and the heat sink 3, it is possible to suppress the abovementioned cutting (breaking) of wire and exfoliation by the elastic member 4 pressing against the drive circuit chip 2 at an inner side than the apex portion, such that the elastic member 4 does not overlap with the apex portion 2A of the drive circuit chip 2. Furthermore, when the length of the elastic member 4 in the predetermined direction is shorter than the length of the drive circuit chip 2 in that direction, it is possible to arrange such that the elastic member 4 does not overlap with the apex portion of the drive circuit chip 2.

Furthermore, in this embodiment, for positioning the drive circuit chip 2 accurately at a predetermined position with respect to the heat sink 3, a dent 31 which accommodates the drive circuit chip 2 is provided in a surface of the heat sink 3, the surface making a contact with the drive circuit chip 2. In this manner, the surface of the heat sink 3, facing the drive circuit chip 2 is larger than the drive circuit chip 2, and the dent 31 which accommodates the drive circuit chip 2 is provided. Therefore, it is possible to bring the entire surface of the drive circuit chip 2 in contact with the heat sink 3 accurately by positioning the drive circuit chip 2 in the dent 31, and it is possible to release accurately the heat which is generated in the drive circuit chip 2.

Figure 4:
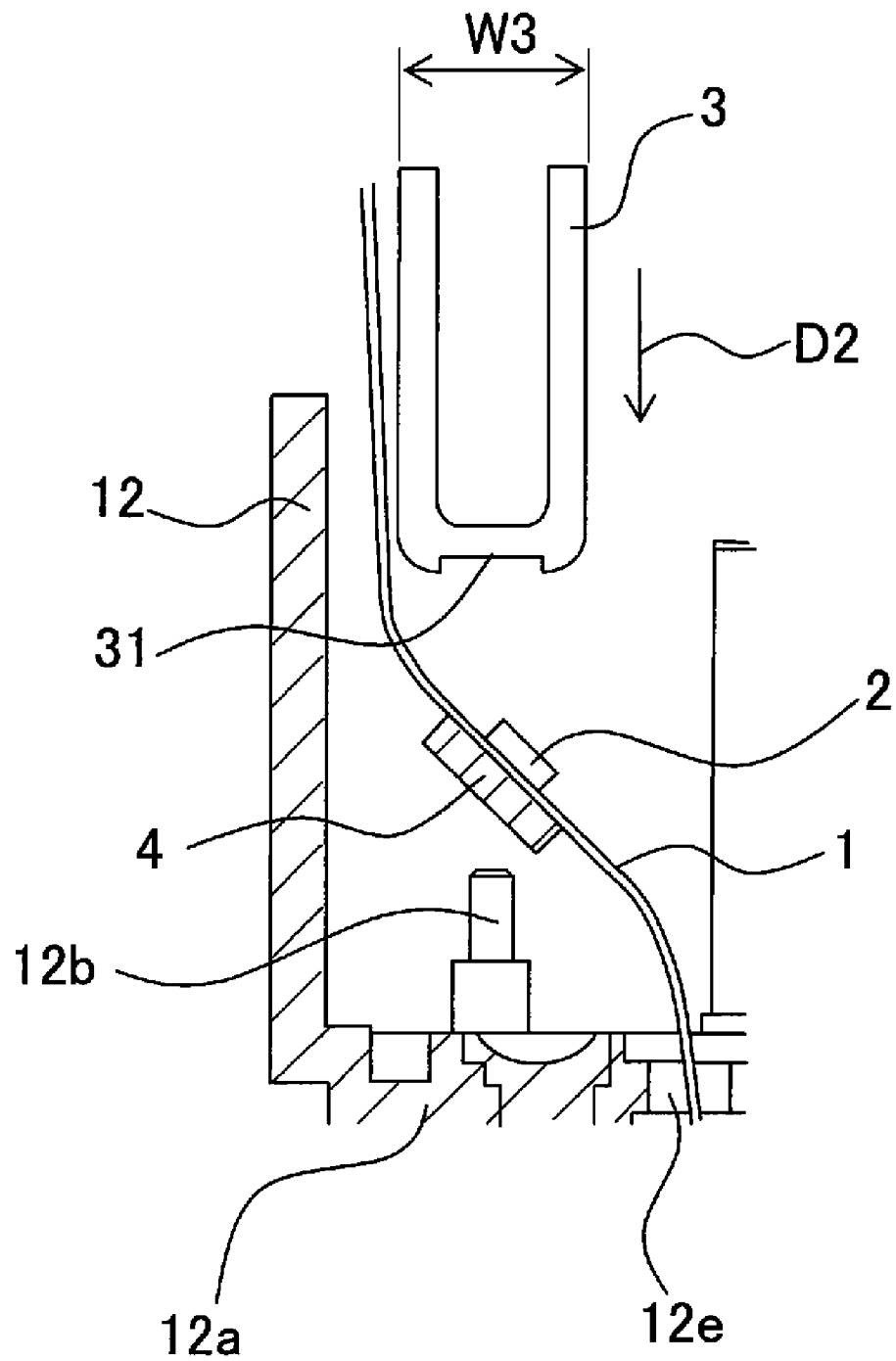
FIG. 4 is a cross-sectional view of main components in FIG. 2, explaining a process of assembling the heat sink to a casing.

As shown in FIG. 4, before mounting the heat sink 3 on the casing 12, the flexible flat cable 1 is drawn to be lifted up through the slit 12e, and the drive circuit chip 2 is in a state of being lifted off (relieved) from the bottom wall 12a. For fixing the heat sink 3 to the bottom surface 12a in this state, the drive circuit chip 2 which has been lifted off is to be pressed toward the bottom wall 12a by the heat sink 3 (a direction of D2 in FIG. 4). At this time, there is a fear that the drive circuit chip 2 slips on a bottom surface of the heat sink 3 and is disengaged (be run off) from the heat sink 3. When the bottom surface (second contact surface) 3A of the heat sink 3 is flat, for preventing this, it is necessary to form a width W3 of the heat sink 3 in the extending direction of the flexible flat cable 1 to be substantial.

However, when the dent 31 described above is formed in the bottom surface 3A of the heat sink 3, since it is possible to position the drive circuit chip 2 in the heat sink 3 without the drive circuit chip 2 being disengaged (run off), it is possible to make small the width W3 of the heat sink 3, and to reduce the size of the casing.

Moreover, the elastic member 4 may be fixed in advance to an upper surface of the bottom wall 12a, and it is also possible to fix the elastic member 4 in advance to a rear side of the flexible flat cable 1 at which the drive circuit chip 2 is positioned. When the elastic member 4 is fixed to the rear side of the flexible flat cable 1, it is possible to fix a relative positions between the drive circuit chip 2 and the elastic member 4 during the arrangement. Further, even when the heat sink 3 is brought in contact, there is no one-side hitting with respect to the drive circuit chip 2, and it is possible to prevent an assembling defect.

Providing the dent 31 in the heat sink 3, and fixing in advance the elastic member 4 to the rear side of the flexible flat cable 1 are not necessary for setting a size relationship (dimensional relationship) between the drive circuit chip 2 and the elastic member 4 as in FIG. 3. Moreover, it is possible to provide the dent 31 in the heat sink 3, and to fix in advance the elastic member 4 to the rear side of the flexible flat cable 1, even when the size of the elastic member 4 is larger than the size of the drive circuit chip 2 as shown in FIG. 5.

The electronic device of the present invention may have a structure which includes a circuit element such as a drive circuit chip mounted on the flexible flat cable, and is also effective in electronic devices other than the ink-jet printer described above, such as an apparatus in which a flexible flat cable and a drive circuit chip are connected to a liquid crystal display device, for example.

What is claimed is:

1. An electronic device comprising:
    a flexible flat cable which is extended in a predetermined extending direction;
    a circuit chip having a first contact surface which makes a direct physical contact with an upper surface of the flexible flat cable, the first contact surface having a corner portion;
    a heat sink which is arranged on the circuit chip to make a thermal contact with the circuit chip, and which releases a heat of the circuit chip; and
    an elastic member which is arranged under a lower surface of the flexible flat cable at a position overlapping with the heat sink in a particular direction perpendicular to the lower surface of the flexible flat cable,
    wherein the upper surface of the flexible flat cable covers entirely the first contact surface of the circuit chip; and
    the elastic member does not overlap with the corner portion of the circuit chip, but overlaps with the circuit chip in the particular direction at an inner portion of the circuit chip located inside the corner portion, and the elastic member does not press the flexible flat cable against the corner portion of the circuit chip.

2. The electronic device according to claim 1, wherein the circuit chip has a rectangular shape having a predetermined width and a predetermined length; and one of a width and a length of the elastic member is smaller than each of the width and the length of the circuit chip.

3. The electronic device according to claim 1, wherein the circuit chip has a rectangular shape which is elongated in an orthogonal direction orthogonal to the extending direction; and a length of the elastic member in the orthogonal direction is smaller than a length of the circuit chip in the orthogonal direction.

4. The electronic device according to claim 1, wherein the heat sink has a second contact surface which makes a contact with the circuit chip;
    the second contact surface covers entirely a surface of the circuit chip, which faces the second contact surface; and
    a dent which is capable of accommodating the circuit chip is formed in the second contact surface.

5. The electronic device according to claim 1, wherein the elastic member is fixed to the lower surface of the flexible flat cable at a position overlapping with the circuit chip.

6. The electronic device according to claim 1, wherein the elastic member is made of a rubber.

7. An electronic device comprising:
    a flexible flat cable which is extended in a predetermined extending direction;
    a circuit chip having a first contact surface which makes a direct physical contact with an upper surface of the flexible flat cable, the first contact surface having a corner portion and two edge line portions which are extended from the corner portion;
    a heat sink which is arranged on the circuit chip to make a thermal contact with the circuit chip, and which releases a heat of the circuit chip; and
    an elastic member which is arranged under a lower surface of the flexible flat cable at a position overlapping with the heat sink in a particular direction perpendicular to the lower surface of the flexible flat cable,
    wherein the upper surface of the flexible flat cable covers entirely the first contact surface of the circuit chip; and
    the elastic member does not overlap with one of the edge line portions of the circuit chip in the particular direction.

8. The electronic device according to claim 7, wherein the circuit chip has a rectangular shape having a predetermined width and a predetermined length; and one of a width and a length of the elastic member is smaller than each of the width and the length of the circuit chip.

9. The electronic device according to claim 7, wherein the circuit chip has a rectangular shape which is elongated in an orthogonal direction orthogonal to the extending direction; and a length of the elastic member in the orthogonal direction is smaller than a length of the circuit chip in the orthogonal direction.

10. The electronic device according to claim 7, wherein the heat sink has a second contact surface which makes a contact with the circuit chip; and the second contact surface covers a surface of the circuit chip facing the second contact surface, and a dent which is capable of accommodating the circuit chip is formed in the second contact surface.

11. The electronic device according to claim 7, wherein the elastic member is fixed to the lower surface of the flexible flat cable at a position overlapping with the circuit chip.

12. The electronic device according to claim 7, wherein the elastic member is made of a rubber.

13. The electronic device according to claim 1, wherein the heat sink is formed of a metallic plate which is bent in a U shape.

14. The electronic device according to claim 7, wherein the heat sink is formed of a metallic plate which is bent in a U shape.

* * * * *